United States Patent
Love et al.

(10) Patent No.: US 10,715,278 B2
(45) Date of Patent: Jul. 14, 2020

(54) TRANSCODING WIRELESS COMMUNICATION SYSTEM

(71) Applicant: Purdue Research Foundation, West Lafayette, IN (US)

(72) Inventors: David J. Love, West Lafayette, IN (US); Chih-Chun Wang, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 16/143,446

(22) Filed: Sep. 26, 2018

(65) Prior Publication Data
US 2019/0238263 A1    Aug. 1, 2019

Related U.S. Application Data

(60) Provisional application No. 62/563,626, filed on Sep. 26, 2017.

(51) Int. Cl.
| | |
|---|---|
| *H03M 7/30* | (2006.01) |
| *H03M 13/13* | (2006.01) |
| *H03M 13/25* | (2006.01) |
| *H03M 13/29* | (2006.01) |
| *H04L 1/00* | (2006.01) |
| *H04L 5/00* | (2006.01) |
| *H04W 28/06* | (2009.01) |

(52) U.S. Cl.
CPC ........ *H04L 1/0076* (2013.01); *H03M 7/3082* (2013.01); *H03M 13/136* (2013.01); *H03M 13/253* (2013.01); *H03M 13/2906* (2013.01); *H04L 1/0041* (2013.01); *H04L 1/0045* (2013.01); *H04L 1/0057* (2013.01); *H04L 1/0064* (2013.01); *H04L 5/0044* (2013.01); *H04W 28/065* (2013.01)

(58) Field of Classification Search
CPC .. H03M 7/001–707; H03M 13/01–356; H04B 7/02; H04B 7/04; H04B 7/0413; H04B 7/0456–0486; H04B 7/14–17; H04L 1/0001–0668; H04L 5/003–0046; H04W 4/70; H04W 28/02–065; H04W 72/1263–1273; H04W 84/18–22; H04W 88/04; H04W 92/02
See application file for complete search history.

(56) References Cited

U.S. PATENT DOCUMENTS

| | | | | |
|---|---|---|---|---|
| 2005/0265387 | A1* | 12/2005 | Khojastepour | ........ H04L 1/0041 370/467 |
| 2007/0297498 | A1* | 12/2007 | Kramer | .............. H04B 7/15557 375/211 |
| 2015/0067454 | A1* | 3/2015 | Benammar | ........... H04L 5/0023 714/807 |

* cited by examiner

*Primary Examiner* — Timothy J Weidner
(74) *Attorney, Agent, or Firm* — Purdue Research Foundation

(57) ABSTRACT

A system and method for operating a wireless communication node. The system configures the node to receive a signal encoded by one or more codeword sets and configures the node to remap subpackets of the incoming signal for transmission over a second communication link. Incoming signals are parsed into subpackets, and the subpackets are encoded and remapped. The encoded and/or remapped subpackets are then transmitted over a communication link.

20 Claims, 4 Drawing Sheets

Block diagram of an exemplary transcoding relay

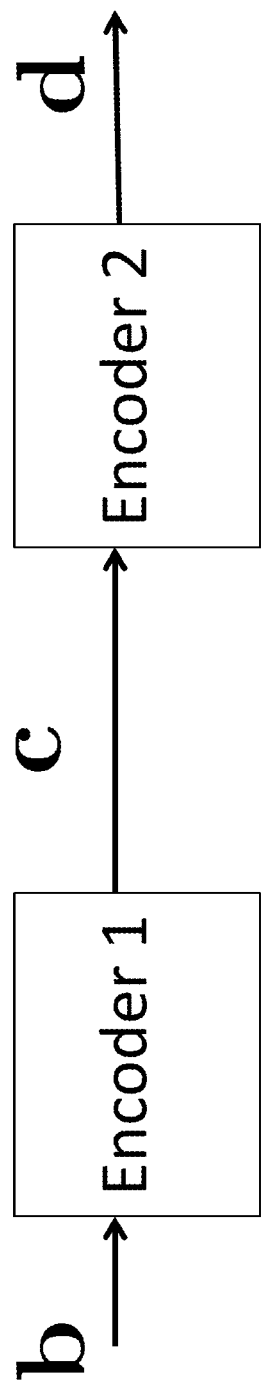
Fig 1: Block diagram of an exemplary transmitter

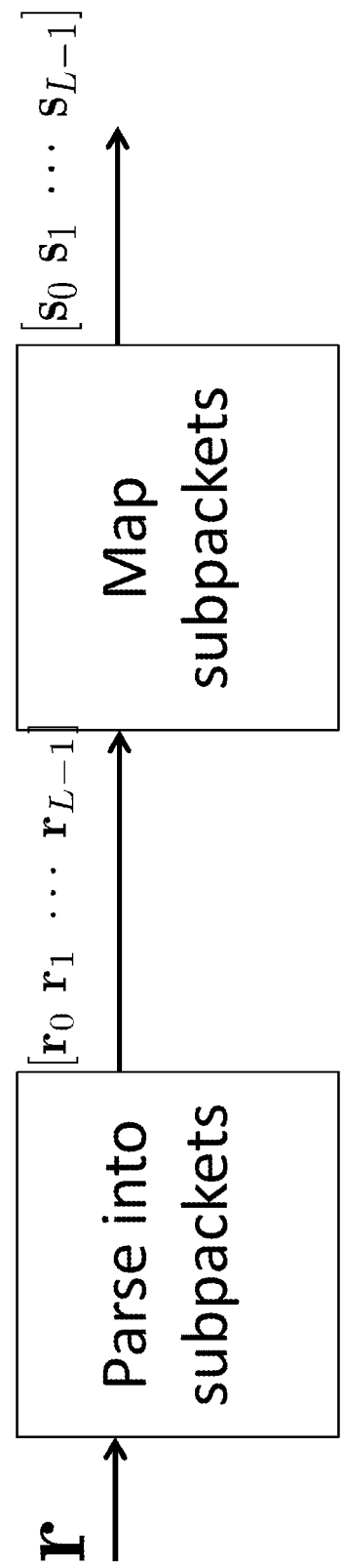
Fig. 2: Block diagram of an exemplary transcoding relay

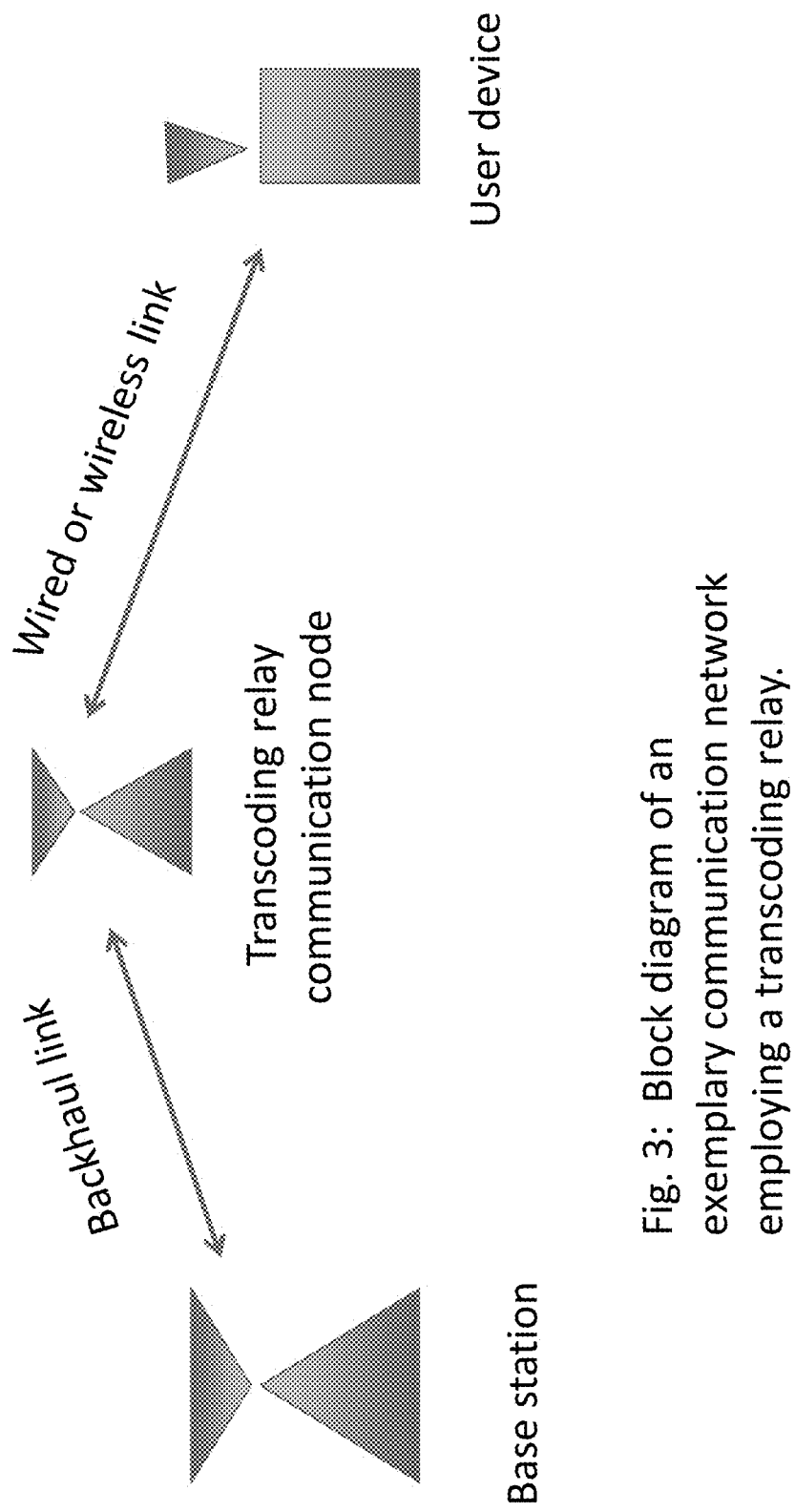
Fig. 3: Block diagram of an exemplary communication network employing a transcoding relay.

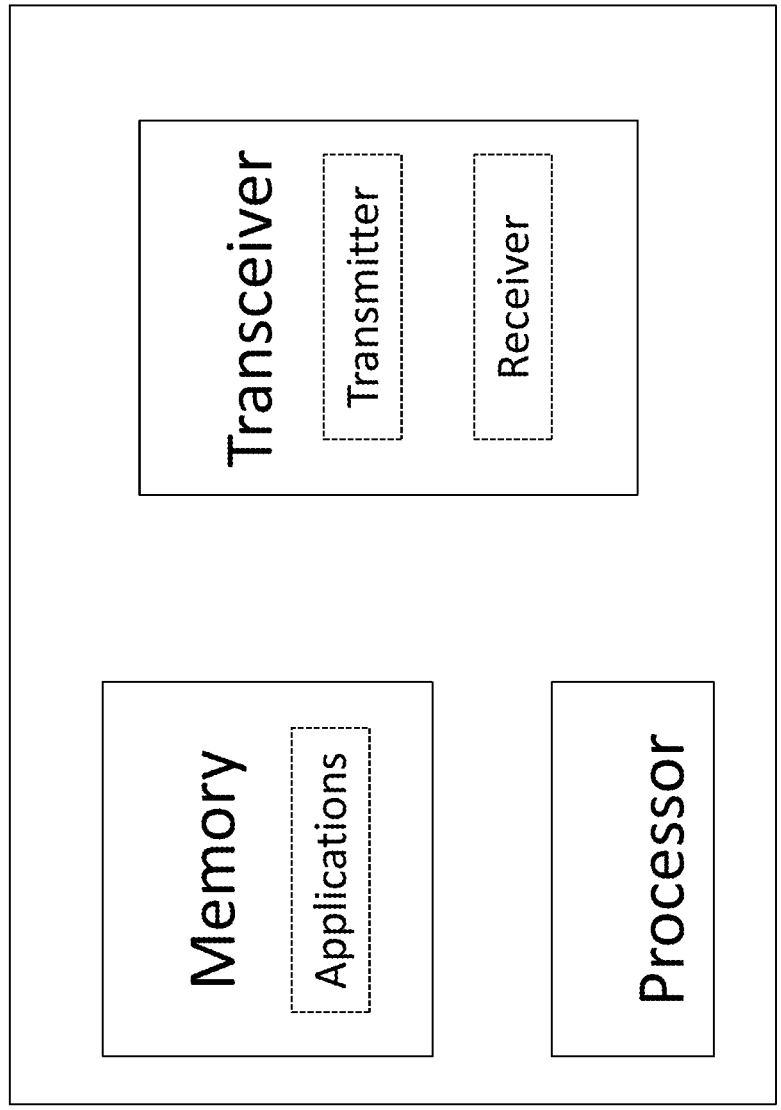

TRANSCODING WIRELESS COMMUNICATION SYSTEM

CROSS-REFERENCE TO RELATED APPLICATIONS

The present patent application is related to and claims the priority benefit of U.S. Provisional Patent Application Ser. No. 62/563,626, filed Sep. 26, 2017, the contents of which is hereby incorporated by reference in its entirety into the present disclosure.

TECHNICAL FIELD

This specification is directed, in general, to wired and wireless communications, and, more specifically, to systems and methods for relaying, integrated access and backhaul, and latency reduction for communication networks.

BACKGROUND

Historically, wireless networks have been used as a last-hop connection technology, where the wireless device communicates with another device that is connected to a high-rate wired connection. This wired-to-wireless interface is commonly found in cellular and wireless local area network (WLAN) applications. Despite the enormous amount of research focused on multi-hop wireless networks, the commercial applications have been limited.

The increasing numbers of wireless connected devices and access points are altering this model. Many of these devices will be low-power and low-complexity Internet of Things (IoT) devices. Due to the low transmit powers of these nodes, a large fraction of the deployed IoT devices will not have any single-hop connection to a base station or access point. Multi-hop deployments will be critical to facilitating many of the proposed IoT applications.

Simultaneously, cellular systems, primarily deployed using 3GPP technical standards such as LTE and LTE-Advanced, are moving towards small cell models. Traditional fiber or copper backhaul networks cannot scale to meet the complexity of these complicated small cell deployments. Self-backhauling, where a fraction of the carrier's bandwidth is set aside for backhaul communication, is starting to dominate future deployment discussions. Though not generally thought of as multihop framework, self-backhauling systems clearly fall inside the academic multihop paradigm.

These commercial multihop deployments are further complicated by the growing focus on latency. 5G systems have a goal of a 10× latency improvement over 4G systems. When these low-latency requirements are combined with any self-backhaul or IoT scenarios, the results are troubling. This is primarily because the design of standardized systems focuses on long blocklengths, which are decoded and reencoded at intermediate nodes.

This new research area is best practically illustrated by 3GPP's recent focus on Integrated Access and Backhaul (see 3GPP TDoc RP-17148). This recently proposed study item aims to address multiple 5G requirements including that the network "shall support multi-hop wireless self-backhauling . . . to enable flexible extension of range and coverage area", "shall support autonomous adaptation on wireless self-backhaul network topologies to minimize service disruptions", and "shall support topologically redundant connectivity on the wireless self-backhaul . . . enhance reliability and capacity and reduce latency".

The challenge of multihop communication with tight latency and/or computational constraints is of immediate commercial and academic interest. Finite blocklength information theoretic analysis has only recently become an area of emphasis within the research community. Instead of proposing a new ad-hoc design for specific applications, a general framework is needed.

Similar problems also arise in wired networks. Heterogeneous wired networks are commonly found. An example is a high-rate fiber line being interfaced to an Ethernet network, and such a wired multihop scenario faces the same challenges as the wireless counterpart, i.e., how to design low-latency high-throughput schemes. Therefore, improvements are needed in the field.

To address these, and other shortcomings of existing relaying and multi-hop techniques, the present disclosure provides a comprehensive technique referred to herein as "transcoding" which can improve throughput, reduce latency, and decrease computational demands at intermediate nodes.

SUMMARY

According to one aspect, the present disclosure provides a method of operating a communication node, comprising configuring the node to receive a signal encoded by one or more codeword sets, configuring the node to remapping subpackets of the incoming signal for transmission over a second communication link, receiving an incoming signal, parsing the received signal into subpackets, encoding and remapping each of the subpackets, and transmitting the encoded and/or remapped subpackets over a communication link.

According to another aspect, the present disclosure provides a communication node apparatus comprising circuitry for configuring the node to receive a signal encoded by one or more codeword sets, circuitry for configuring the node to reencode/remap subpackets of the incoming signal for transmission over a second communication link, circuitry for receiving an incoming signal; circuitry for parsing the received signal into subpackets; circuitry for encoding/remapping each of the subpackets, and circuitry for transmitting the encoded/remapped subpackets over a communication link.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein:

FIG. 1 shows an example of a transmitter according to on embodiment.

FIG. 2 shows an example of a transcoding relay according to one embodiment.

FIG. 3 shows a communication network employing a transcoding relay according to one embodiment.

FIG. 4 shows a schematic block diagram of a communication node according to one embodiment.

DETAILED DESCRIPTION

Wired and wireless networks are becoming increasing complicated. Before the transmitted signal reaches its final destination, it must pass through one or more "relay nodes."

A relay node, as used herein, may be an access point, base station, user equipment, portable device, switch, router, communication node, or other communication equipment. Each relay node typically performs an operation like decode-and-forward (DF) or amplify-and-forward (AF). In DF, a relay node would demodulate and/or decode its received signal to produce a detected version of the transmitted bits $b_{rec}$. These bits are then reencoded and remodulated to produce a signal to send over the second hope of the channel (i.e., the relay node sends a signal to the final destination or to another relay node). In AF, the relay node simply scales and retransmits the signal it received.

Relays are found in networks throughout the world, but the de facto industry standard is still the simplest DF policy. Based on the concept proposed in 1979 (see T. Cover and A. El Gamal, "Capacity theorems for the relay channel," *IEEE Trans. Info. Theory*, vol. 25, no. 5, pp. 572-584, September 1979.), DF simplifies the design of a multi-hop network into the concatenation of multiple point-to-point links. Each intermediate node thus has to accumulate a whole coding block of received symbols before performing any decoding, re-encoding, and transmission.

This incurs at least[1] a full coding block of delay and requires full operations of the channel coding hardware for every intermediate node. Since both the delay and the complexity of DF increase linearly with respect to the number of hops, the delay-throughput performance of DF is significantly suboptimal for modern high-performance applications (i.e., self-backhauling) and the computational/power cost may also be prohibitively high for the low-power scenarios (i.e., IoT).

[1] This delay estimate is optimistic since we assume that decoding and re-encoding operations are instantaneous and do not incur any decoding delay.

AF actually avoids such a delay and complexity penalty by simply amplifying the received signal without any block coding/decoding. However, for almost all scenarios, the low cost of AF is accompanied by substantial throughput-loss (30-70% compared to DF) due to the noise accumulated at the intermediate node.

The present disclosure provide a novel technique, referred to herein as "transcoding." In transcoding, the relay partially decodes or partially processes the received signal before transmission. This avoids the delay and computational issues associated with DF and significantly improves upon the performance of AF.

Systems and methods for relaying in wired and wireless networks are described herein. In an illustrative, non-limiting embodiment, a method may include a transmit signal employing an error control code (constructed in some field such as the binary field, real numbers, or complex numbers). This error control code may be constructed through the concatenation of two or more error control codes. In the case of two error control codes, a number of transmit bits b is encoded using a first error control code to yield $c=Q_1(b)$ as shown in FIG. 1. The dimension of b may be denoted by k, and the dimension of c may be denoted by $n_1$, where $c=[c_1 c_2 \ldots c_{n1}]$ This would mean the first code is of rate $k/n_1$. The units of this rate are field elements/coded symbols, which corresponds to bits/coded symbols in the binary case.

If the code is binary, the code could be constructed from any code including a low density parity check (LDPC) code, polar code, turbo code, convolutional code, or Reed-Solomon code. Turbo codes and convolutional codes are used in LTE, LTE-Advanced, and LTE-Advanced Pro (see coding discussion in 3GPP TS 36.211, 36.212, 36.213). LDPC and polar codes have recently been adopted for the 5G standard (often called 5GNR), with initial standardization activity summarized in 3GPP TS 38 series documents. These include 3GPP TS 38.211, 38.212, 38.213.

The first error control code output c is then encoded by a second code to yield $d=Q_2(c)$ as shown in FIG. 1. This is sometimes called a concatenated code. The codeword d is then sent through a wired or wireless channel. The code could be modulated in some way before transmission. The set of all possible c is denoted by $C_1$, and the set of all possible d is denoted by $C_2$. In our scenario, the code $C_2$ is typically built upon concatenating multiple short codes. For example, the inner code (i.e., the $C_2$ code) might be constructed by dividing the $n_1$ elements (i.e., bits in the binary case) produced by the outer code into L small chunks (or subpackets) $c=[[c_1 c_2 \ldots c_{k1}] [C_{k1+1} c_{k1+2} \ldots c_{2k1}] [c_{(L-1)k1+1} c_{(L-1)k1+2} \ldots c_{Lk1}]]$.

Each of the L subpackets can then be encoded using a shorter code that takes k1 input symbols and generates m coded symbols. Example codes include, but are not limited to, Hamming codes, Reed-Mueller codes, convolutional codes, cyclic codes, and polar codes. The output of the inner code is then the concatenated vector $d=[[d_1 d_2 \ldots d_m] [d_{m+1} d_{m+2} \ldots d_{2m}] \ldots [d_{(L-1)m+1} d_{(L-1)m+2} \ldots d_{Lm}]]$. In this terminology, the short code used to produce the inner code is of rate $k_1/m$. Each encoded subpacket is chosen from a codeword set D. The entire coded stream is of length $n_2=Lm$. If the short code producing the inner code is a linear block code, each subpacket $d_i$ is written as $d_i=c_iG$ where G is the short code's generator matrix. Here $c_i=[c_{ik1+1} c_{ik1+2} \ldots c_{(i+1)k1}]$ and $d_i=[d_{im+1} d_{im+2} \ldots d_{(i+1)m}]$.

In an example embodiment, the transcoder works by processing the inner code (i.e., the $C_2$ code). As shown in FIG. 2, if the received signal is $r=[[r_1 r_2 \ldots r_m] [r_{m+1} r_{m+2} \ldots r_{2m}] [r_{(L-1)m+1} r_{(L-1)m+2} \ldots r_{Lm}]]$, the transcoder may map each of the subpackets $r_i=[r_{im+1} r_{im+2} \ldots r_{(i+1)m}]$ to a new subpacket $s_i=[s_{iq+1} s_{iq+2} \ldots s_{(i+1)q}]$ of length q, for $i=0, \ldots, (L-1)$, separately. The value of q could be equal to m or different. The mapping for $r_i$ to $s_i$ to can be many-to-one, i.e., the inverse mapping from $r_i$ to $s_i$ needs not be unique. The ways to construct the mapping include, but are not limited to, distance-based channel decoding, likelihood-based channel decoding, nested lattice code based joint source and channel encoding, nested polar-code based decoding, partial channel decoding, etc.

One embodiment of the mapping when q=m is for the transcoder to decode each $r_i$ to obtain a received version of the subpacket, denoted by $d_{i,rec}$. The distance (e.g., using some distance like Hamming distance, Euclidean distance, etc.) of $d_{i,rec}$ from $r_i$ could be computed. If the distance is less than some threshold, $d_{i,rec}$ is transmitted on the second hop. If the distance is greater than some threshold, $r_i$ is transmitted on the second hop.

This short code could also be nested. One definition of a nested code is when D is a subset of another set $D_{expand}$. One way to constructed a nested code D is to expurgate the code $D_{expand}$. This structure gives rise to another embodiment for transcoding. In this embodiment the relay can decode each subpacket $r_i$ over the codeword set $D_{expand}$. If $D_{expand}$ is a linear block code with generator matrix $G_{expand}$, then the relay can decode over this larger code, which generates more decoder output bits. In this framework, the relay functions like a source coder using an error control coding structure for the source code.

As mentioned earlier, transcoding can be implemented over any field. An error control code may be combined with modulation. In this scenario, the transcoding could apply to the modulation, error control code, or both. Note that one or both codes can be combined with interleaving. An embodiment of transcoding in the real field is to use lattice codes. In this embodiment, the inner code could be a lattice code. The transcoder could decode using this lattice code or a nested lattice code.

Transcoding could also be implemented over multiple relay nodes operating in parallel and/or serial. Each node would have a transcoder designed in a complementary way to maximize throughput. This implementation could be sequential.

In a further embodiment, the relay will decode the inner code of each of the subpackets and transmit them to the destination directly. However, at the end of receiving all subpackets from the source, the relay will then decode the correct, final information bits and compare the bit string to the inner code decision made earlier for each subpacket. If there was any error made during the inner-decoding, then an additional correction subpackage is sent to the destination to inform the destination how to ignore or compensate for the erroneous subpackets sent earlier. The overall correction mechanisms will take advantage of the structures of both the inner and outer codes to further reduce the error rate.

Yet another embodiment of the transcoder implementation uses linear-programming-based (LP-based) optimization tools when designing the optimal transcoder. Specifically, the LP-based tools can be used to find the encoder/decodering mappings that maximize the end-to-end Hamming or Euclidean distances. By maximizing the Hamming or Euclidean distance, the transcoder will improve the signal-to-noise ratio experienced by the outer code and thus decrease the error rate and shorten the delay.

In another illustrative, non-limiting embodiment, the transcoder may be implemented in a backhaul modem. Standardized techniques, such as those discussed for the Integrated Access and Backhaul study item in 3GPP, could use transcoding at each backhaul model. The backhaul may include a processor and a memory coupled to the processor, the memory configured to store program instructions executable by the processor to cause the device to: be configured for transcoding, receive an incoming signal over a wired or wireless link, and map (or transcode) subpackets of the incoming signal to subpackets for transmission over a next hop.

In yet another illustrative, non-limiting embodiment, a non-transitory electronic storage medium may have program instructions stored thereon that, upon execution by a processor of a device, cause the device to: be configured for transcoding, receive an incoming signal over a wired or wireless link, map (or transcode) subpackets of the incoming signal to subpackets for transmission over a next hop.

In certain embodiments, one or more communications devices or computer systems may perform one or more of the techniques described herein. In other embodiments, a tangible computer-readable or electronic storage medium may have program instructions stored thereon that, upon execution by one or more communications devices or computer systems, cause the one or more communications devices or computer systems to execute one or more operations disclosed herein. In yet other embodiments, a communications system (e.g., a device or modem) may include at least one processor and a memory coupled to the at least one processor (as shown in FIG. 4). Examples of a processor include, but are not limited to, an application specific integrated circuit (ASIC), a system-on-chip (SoC) circuit, a field-programmable gate array (FPGA), a digital signal processor (DSP), a microprocessor, or a microcontroller. The memory may be configured to store program instructions executable by the at least one processor to cause the system to execute one or more operations disclosed herein.

Many of the operations described herein may be implemented in hardware, software, and/or firmware, and/or any combination thereof. When implemented in software, code segments perform the necessary tasks or operations. The program or code segments may be stored in a processor-readable, computer-readable, or machine-readable medium. The processor-readable, computer-readable, or machine-readable medium may include any device or medium that can store or transfer information. Examples of such a processor-readable medium include an electronic circuit, a semiconductor memory device, a flash memory, a ROM, an erasable ROM (EROM), a floppy diskette, a compact disk, an optical disk, a hard disk, a fiber optic medium, etc. Software code segments may be stored in any volatile or non-volatile storage device, such as a hard drive, flash memory, solid state memory, optical disk, CD, DVD, computer program product, or other memory device, that provides tangible computer-readable or machine-readable storage for a processor or a middleware container service. In other embodiments, the memory may be a virtualization of several physical storage devices, wherein the physical storage devices are of the same or different kinds. The code segments may be downloaded or transferred from storage to a processor or container via an internal bus, another computer network, such as the Internet or an intranet, or via other wired or wireless networks.

Many modifications and other embodiments of the invention(s) will come to mind to one skilled in the art to which the invention(s) pertain having the benefit of the teachings presented in the foregoing descriptions, and the associated drawings. Therefore, it is to be understood that the invention(s) are not to be limited to the specific embodiments disclosed. Although specific terms are employed herein, they are used in a generic and descriptive sense only and not for purposes of limitation.

The invention claimed is:

1. A method of operating a communication relay node, comprising:
configuring the communication relay node to receive a signal vector that represents a message encoded by one or more codeword sets;
configuring the communication node to remap a subpacket vector parsed from the received signal vector for transmission over a second communication link;
receiving the signal vector;
parsing the received signal vector into a plurality of subpacket vectors, wherein the respective lengths of the subpacket vectors are less than a length of the received signal vector;
remapping each of the subpacket vectors to one or more transmission vector such that the relationship between the sub-packet vectors and the one or more transmission vector comprises a one-to-one relationship or a one-to many-relationship;
transmitting the one or more transmission vectors over a communication link.

2. The method of claim 1, wherein the communication link is wireless.

3. The method of claim 1, wherein the communication link is wired.

4. The method of claim 1, wherein the received signal vector corresponds to a signal constructed by a different node using a concatenated code.

5. The method of claim 4, wherein the inner code of the concatenated code is formed using a short code.

6. The method of claim 5, wherein the communication node encodes the received signal vector by decoding/remapping each of the subpacket vectors using the short code.

7. The method of claim 5, where the codeword set for the short code is a subset of an expanded code.

8. The method of claim 7, where the communication node encodes the received signal vector by decoding/remapping each of the subpacket vectors using the expanded code.

9. A communication relay node apparatus, comprising:
circuitry for configuring the node to receive a signal vector that represents a message encoded by one or more codeword sets;
circuitry for configuring the node to remap a subpacket vector parsed from the received signal for transmission over a second communication link;
circuitry for receiving the signal vector;
circuitry for parsing the received signal vector into a plurality of subpacket vectors, wherein the respective lengths of the subpacket vectors are less than a length of the received signal vector;
circuitry for remapping each of the subpacket vectors to one or more transmission vector such that the relationship between the sub-packet vectors and the one or more transmission vectors comprises a one-to-one relationship or a one to many relationship;
circuitry for transmitting the one or more transmission vectors over a communication link.

10. The apparatus of claim 9, wherein the communication link is wireless.

11. The apparatus of claim 9, wherein the communication link is wired.

12. The apparatus of claim 9, wherein the received signal vector corresponds to a signal constructed by a different node using a concatenated code.

13. The apparatus of claim 12, wherein the inner code of the concatenated code is formed using a short code.

14. The apparatus of claim 13, wherein the communication node encodes the received signal vector by decoding each of the subpacket vectors using the short code.

15. The apparatus of claim 13, wherein the codeword set for the short code is a subset of an expanded code.

16. The apparatus of claim 15, wherein the communication node encodes the received signal vector by decoding each of the subpacket vectors using the expanded code.

17. The apparatus of claim 9, wherein the received signal vector is received from a backhaul link.

18. The apparatus of claim 9, wherein the remapped subpacket vectors are sent over a backhaul link.

19. The apparatus of claim 9, wherein the communication node is an Internet of Things (IoT) device.

20. The apparatus of claim 9, wherein the communication node is a base station.

* * * * *